United States Patent
Su et al.

(10) Patent No.: US 10,070,549 B2
(45) Date of Patent: Sep. 4, 2018

(54) REMOVAL ASSEMBLY

(71) Applicant: NEXTRONICS ENGINEERING CORP., New Taipei (TW)

(72) Inventors: Hou-An Su, Keelung (TW); Yu-Liang Shao, Keelung (TW)

(73) Assignee: NEXTRONICS ENGINEERING CORP., New Taipei (TW)

(*) Notice: Subject to any disclaimer, the term of this patent is extended or adjusted under 35 U.S.C. 154(b) by 199 days.

(21) Appl. No.: 14/972,428

(22) Filed: Dec. 17, 2015

(65) Prior Publication Data
US 2017/0042054 A1  Feb. 9, 2017

(30) Foreign Application Priority Data
Aug. 5, 2015  (TW) .............................. 104212603 U

(51) Int. Cl.
*H05K 7/14*  (2006.01)

(52) U.S. Cl.
CPC ........ H05K 7/1409 (2013.01); *Y10T 403/595* (2015.01)

(58) Field of Classification Search
CPC .. H05K 7/1405; H05K 7/1402; H05K 7/1409; Y10T 403/59; Y10T 403/591; Y10T 403/595; Y10T 403/60; Y10T 403/602; Y10T 403/604; Y10S 292/11; Y10S 292/30; Y10S 292/31; E05C 3/006; E05C 3/04; E05C 2005/005
USPC ........ 439/159, 160, 152; 361/747, 727, 802, 361/803; 403/321, 322.1, 322.4, 403/326–328, DIG. 4
See application file for complete search history.

(56) References Cited

U.S. PATENT DOCUMENTS

| | | | | |
|---|---|---|---|---|
| 419,881 A | * | 1/1890 | Proctor | E05B 85/24 292/207 |
| 2,655,395 A | * | 10/1953 | Groeger | E05B 65/0053 109/63.5 |
| 3,149,867 A | * | 9/1964 | Odend | E05B 65/0053 292/226 |
| 3,706,467 A | * | 12/1972 | Martin | E05C 19/14 292/111 |
| 4,083,616 A | * | 4/1978 | McNiece | E05B 17/0025 439/157 |
| 4,233,646 A | * | 11/1980 | Leung | H05K 7/1409 211/41.17 |

(Continued)

FOREIGN PATENT DOCUMENTS

CN  103841789 A  *  6/2014  ........... H05K 7/1409

*Primary Examiner* — Josh Skroupa
(74) *Attorney, Agent, or Firm* — Li & Cai Intellectual Property (USA) Office

(57) ABSTRACT

A removal assembly includes a main body, a positioning element, an elastic element, an actuating element, and a wrench element. The positioning element is movably disposed in an inner space of the main body, including a clasp part and an oblique side surface, and the clasp part extends out of the main body. The elastic element is disposed between the main body and the positioning element. The actuating element is pivotally installed in the inner space of the main body, including a pressing part and an abutting part, the pressing part extends out of the main body, and the abutting part abuts against the oblique side surface of the positioning element. The wrench element is connected to the main body, including a fixing part and a pivoting part.

8 Claims, 4 Drawing Sheets

(56) References Cited

U.S. PATENT DOCUMENTS

| | | | | |
|---|---|---|---|---|
| 4,313,150 A * | 1/1982 | Chu | H05K 7/1409 | 361/755 |
| 4,629,209 A * | 12/1986 | Lorenz | A63C 9/0842 | 280/626 |
| 4,632,588 A * | 12/1986 | Fitzpatrick | H05K 7/1409 | 361/759 |
| 4,975,073 A * | 12/1990 | Weisman | H01R 12/7005 | 439/153 |
| 5,057,029 A * | 10/1991 | Noorily | H01R 13/633 | 439/157 |
| 5,309,325 A * | 5/1994 | Dreher | H05K 7/1409 | 361/754 |
| 5,413,497 A * | 5/1995 | Lwee | H01R 12/721 | 439/326 |
| 5,414,594 A * | 5/1995 | Hristake | H05K 7/1409 | 361/754 |
| 5,492,480 A * | 2/1996 | Fusselman | G06K 13/08 | 439/155 |
| 5,577,922 A * | 11/1996 | Enomoto | H01R 13/635 | 439/157 |
| 5,620,213 A * | 4/1997 | Ellis | E05B 13/10 | 292/100 |
| 5,782,114 A * | 7/1998 | Zeus | E05C 9/002 | 292/150 |
| 5,989,043 A * | 11/1999 | Han | H05K 7/1414 | 439/157 |
| 6,009,732 A * | 1/2000 | Haeck | E05B 17/06 | 292/92 |
| 6,058,579 A * | 5/2000 | Brocklesby | H05K 7/1409 | 24/458 |
| 6,128,198 A * | 10/2000 | Kurrer | H05K 7/1409 | 200/292 |
| 6,148,506 A * | 11/2000 | Vermette | B25B 9/00 | 29/729 |
| 6,185,106 B1 * | 2/2001 | Mueller | H05K 7/1409 | 361/754 |
| 6,203,076 B1 * | 3/2001 | Wytcherley | E05B 7/00 | 292/197 |
| 6,220,879 B1 * | 4/2001 | Ulrich | H01R 13/701 | 361/798 |
| 6,276,950 B1 * | 8/2001 | Yodogawa | H01R 12/7005 | 439/160 |
| 6,373,713 B1 * | 4/2002 | Jensen | H05K 7/1409 | 211/41.17 |
| 6,461,169 B1 * | 10/2002 | Harrison | H05K 3/366 | 439/55 |
| RE37,916 E * | 12/2002 | Szapucki | E05C 1/10 | 292/175 |
| 6,494,729 B1 * | 12/2002 | Stathopoulos | H01R 13/701 | 439/160 |
| 6,513,841 B1 * | 2/2003 | Jackson | B64D 29/06 | 292/126 |
| 6,554,627 B1 * | 4/2003 | Chen | H01R 13/635 | 439/159 |
| 6,579,029 B1 * | 6/2003 | Sevde | H05K 7/1409 | 403/321 |
| 6,728,109 B1 * | 4/2004 | Wu | G06F 1/181 | 361/679.36 |
| 6,735,089 B1 * | 5/2004 | Byers | H05K 7/1409 | 361/747 |
| 6,738,261 B2 * | 5/2004 | Vier | H05K 7/1429 | 361/679.32 |
| 6,755,448 B2 * | 6/2004 | Jackson | B64D 29/06 | 244/110 B |
| 6,816,388 B2 * | 11/2004 | Junkins | H05K 7/1418 | 361/727 |
| 6,829,150 B2 * | 12/2004 | Larson | H05K 7/1409 | 361/726 |
| 6,916,190 B2 * | 7/2005 | Joist | H05K 7/1414 | 361/732 |
| 6,937,481 B1 * | 8/2005 | Newman | H05K 7/1431 | 361/726 |
| 6,955,550 B2 * | 10/2005 | Schlack | H05K 7/1409 | 439/157 |
| 6,957,979 B2 * | 10/2005 | Welsh | H05K 7/1409 | 439/545 |
| 6,992,900 B1 * | 1/2006 | Suzue | H05K 7/1409 | 361/726 |
| 7,172,441 B2 * | 2/2007 | Schlack | H01R 13/633 | 439/152 |
| 7,301,778 B1 * | 11/2007 | Fang | H05K 7/1487 | 312/223.2 |
| 7,397,674 B2 * | 7/2008 | Schlack | H05K 7/1409 | 361/754 |
| 7,408,788 B2 * | 8/2008 | Rubenstein | H05K 7/1409 | 361/754 |
| 7,455,539 B2 * | 11/2008 | Gunther | H05K 7/1409 | 439/157 |
| 7,575,451 B1 * | 8/2009 | Jaramillo | H01R 12/7005 | 439/157 |
| 7,672,143 B2 * | 3/2010 | Chou | G06F 1/186 | 361/747 |
| 7,684,731 B2 * | 3/2010 | Hirose | B65H 5/00 | 399/124 |
| 7,749,006 B2 * | 7/2010 | Chiang | H05K 7/1409 | 439/160 |
| 8,369,094 B2 * | 2/2013 | McLean | H05K 5/0221 | 361/747 |
| 8,385,076 B2 * | 2/2013 | Peng | H05K 7/1401 | 248/200 |
| 8,544,900 B2 * | 10/2013 | Elbrecht | E05B 13/002 | 292/100 |
| 8,570,731 B2 * | 10/2013 | Zhang | H01R 12/7058 | 361/679.31 |
| 8,665,587 B2 * | 3/2014 | Peng | G06F 1/185 | 361/679.31 |
| 8,867,195 B2 * | 10/2014 | Tsubota | H05K 7/1414 | 361/679.01 |
| 9,291,178 B2 * | 3/2016 | Chang | B25H 1/0042 | |
| 9,585,283 B2 * | 2/2017 | Chia | H05K 7/1489 | |
| 2002/0057550 A1 * | 5/2002 | Ulrich | H01R 13/7035 | 361/600 |
| 2002/0071254 A1 * | 6/2002 | Tien | G06F 1/1616 | 361/727 |
| 2002/0116785 A1 * | 8/2002 | Wytcherley | E05B 17/0025 | 16/110.1 |
| 2003/0128527 A1 * | 7/2003 | Chewning | H05K 7/1414 | 361/747 |
| 2003/0147691 A1 * | 8/2003 | Ho | B62J 7/08 | 403/322.1 |
| 2003/0172523 A1 * | 9/2003 | Joist | H05K 7/1409 | 29/758 |
| 2003/0194892 A1 * | 10/2003 | Korber | H05K 7/1409 | 439/160 |
| 2004/0049903 A1 * | 3/2004 | Koerber | H01R 13/62933 | 29/270 |
| 2004/0192095 A1 * | 9/2004 | Joist | H05K 7/1409 | 439/188 |
| 2005/0014403 A1 * | 1/2005 | Joist | H05K 7/1414 | 439/157 |
| 2006/0053599 A1 * | 3/2006 | Chang | F16B 2/10 | 24/455 |
| 2006/0134953 A1 * | 6/2006 | Williams | H05K 7/1411 | 439/157 |
| 2006/0198115 A1 * | 9/2006 | Chen | G06F 1/184 | 361/796 |
| 2007/0115646 A1 * | 5/2007 | Wu | H05K 7/1431 | 361/747 |
| 2009/0000117 A1 * | 1/2009 | Oila | H05K 7/1409 | 29/876 |
| 2009/0181568 A1 * | 7/2009 | Chiang | H05K 7/1409 | 439/310 |
| 2010/0246142 A1 * | 9/2010 | Phillips | H01R 13/6275 | 361/747 |
| 2010/0265669 A1 * | 10/2010 | Schnuerer | H01Q 1/1207 | 361/747 |
| 2011/0013352 A1 * | 1/2011 | Chuang | G06F 1/187 | 361/679.31 |

(56) References Cited

U.S. PATENT DOCUMENTS

| | | | |
|---|---|---|---|
| 2012/0189380 A1* | 7/2012 | Doherty | E02F 3/3618 403/322.1 |
| 2013/0279124 A1* | 10/2013 | Guo | H01M 2/1066 361/747 |
| 2013/0288492 A1* | 10/2013 | Hack | H05K 7/1408 439/70 |
| 2015/0048727 A1* | 2/2015 | Liu | H05K 7/1409 312/223.2 |
| 2015/0085451 A1* | 3/2015 | Yu | G06F 1/185 361/747 |
| 2015/0296649 A1* | 10/2015 | Wang | H05K 7/1409 403/326 |
| 2015/0327389 A1* | 11/2015 | Westphall | H01R 12/7005 403/322.1 |
| 2016/0120056 A1* | 4/2016 | Kuang | H05K 7/1409 403/322.4 |

* cited by examiner

REMOVAL ASSEMBLY

BACKGROUND OF THE INVENTION

1. Field of the Invention

The instant disclosure relates to a removal assembly; in particular, to a removal assembly disposed in a subrack and configured to remove a daughter board from the subrack.

2. Description of Related Art

A conventional removal assembly disposed in a subrack can be rotated by an operator to implement installation of a daughter board. Specifically, in a use state, the daughter board can be held on a positioning hook of a slidable latch part of the removal assembly, and a fixing part of the removal assembly is clamped on the subrack. Thereby, the daughter board can be prevented from detaching from the subrack. In a non-use state, the slidable latch part can be released by an operator to detach the positioning hook from the daughter board. Then, the fixing part can be detached from the subrack through a reverse rotation of the removal assembly, so that the daughter board can be removed from the subrack.

However, for the conventional removal assembly, such as an ejector lever assembly disclosed in Taiwan Patent No. I280839, the slidable latch part of the removal assembly cannot be operated by any thrust control means. It is difficult for an operator to implement installation of a daughter board.

SUMMARY OF THE INVENTION

The object of the instant disclosure is to provide a removal assembly disposed in a subrack in which thrust control can be easily carried out.

In order to achieve the aforementioned objects, according to an embodiment of the instant disclosure, a removal assembly disposed in a subrack, configured to assist in installation of a daughter board, and comprising a main body, a positioning element, an elastic element, an actuating element, and a wrench element. The main body has an inner space, wherein the main body comprises a handle part at one end thereof. The positioning element is movably disposed in the inner space of the main body, wherein the positioning element comprises a clasp part and an oblique side surface, and the clasp part extends out of the main body. The elastic element is disposed between the main body and the positioning element. The actuating element is pivotally installed in the inner space of the main body, wherein the actuating element comprises a pressing part and an abutting part, the pressing part extends out of the main body, and the abutting part abuts against the oblique side surface of the positioning element. The wrench element is connected to the main body, wherein the wrench element comprises a fixing part and a pivoting part.

Specifically, the main body comprises a starting surface and a stopping surface positioned in the inner space thereof, the positioning element is configured to move between the starting and stopping surfaces, and the oblique side surface is opposite to the starting surface.

Specifically, the elastic element is a spring.

Specifically, the positioning element has two sliding slots which are parallel to each other, the wrench element comprises two guide rails slidably coupled to the sliding slots respectively, and the guide rails extend through the sliding slots and into the inner space of the main body.

The technical solutions provided in the embodiments of the present invention bring the following beneficial effects:

The removal assembly includes a main body, a positioning element, an elastic element, an actuating element, and a wrench element. In a use state, the elastic element is configured to restrict motion of the actuating element relative to the positioning element, wherein the abutting part of the actuating element is configured to abut against the oblique side surface of the positioning element when force is applied to the pressing part of the actuating element. Thereby, thrust control can be easily carried out.

The main body includes a starting surface and a stopping surface positioned in the inner space thereof. The actuating element enables the positioning element to move between the starting and stopping surfaces of the main body.

There is an elastic element disposed between the positioning element and the main body. The deformed elastic element can provide a required resilient force to restrict the motion of the positioning element.

The positioning element has two sliding slots which are parallel to each other, and the wrench element includes two guide rails slidably coupled to the sliding slots respectively. Thereby, the positioning element can be driven by the elastic element to move stably in the inner space of the main body, so that the clasp part of the positioning element can be fittingly engaged with the daughter board.

In order to further appreciate the characteristics and technical contents of the instant disclosure, references are hereunder made to the detailed descriptions and appended drawings in connection with the instant disclosure. However, the appended drawings are merely shown for exemplary purposes, rather than being used to restrict the scope of the instant disclosure.

DETAILED DESCRIPTION OF THE PREFERRED EMBODIMENTS

Figure 1:
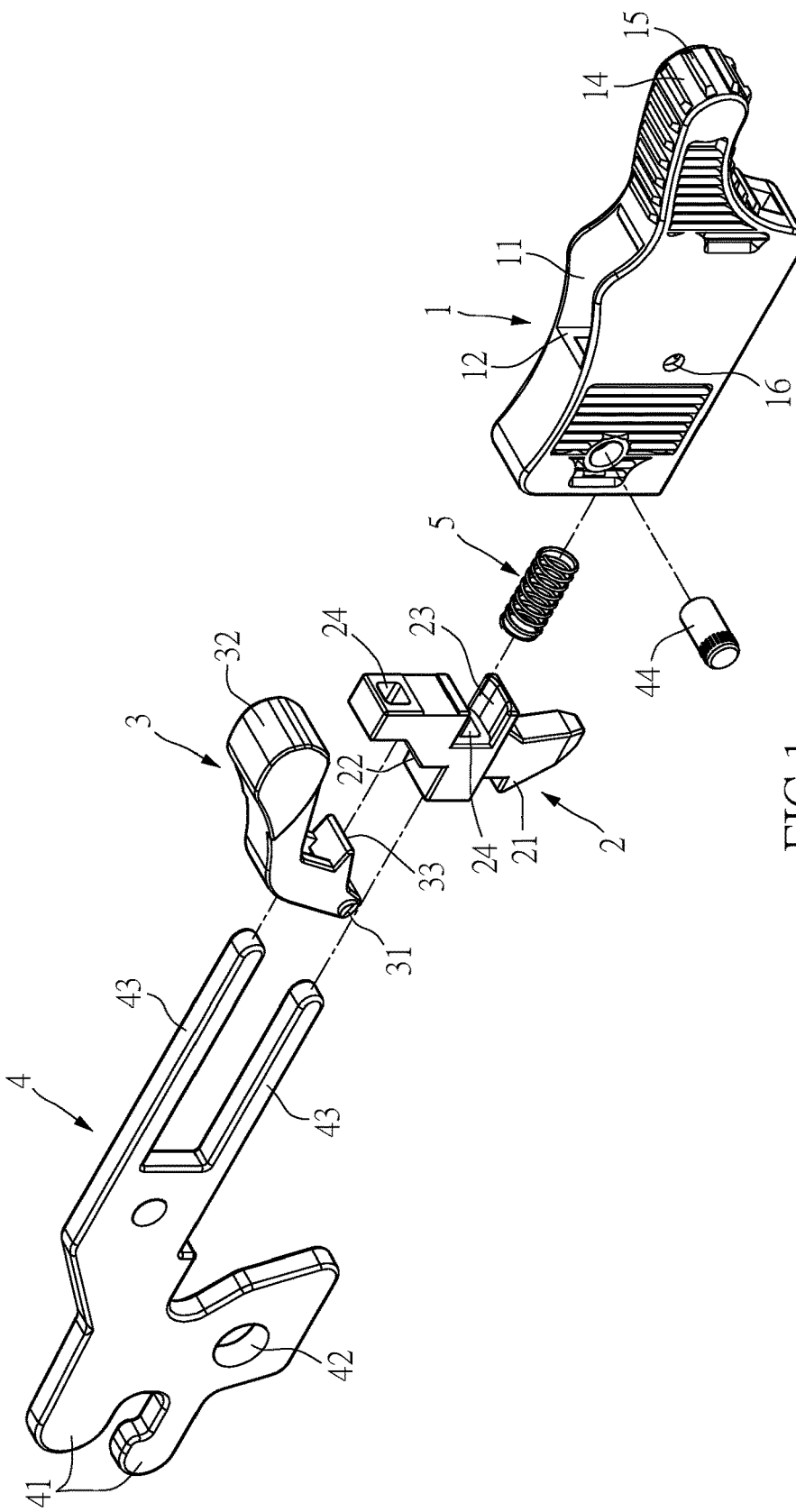
FIG. 1 is an exploded view of the removal assembly according to a first embodiment of the instant disclosure.
Figure 2:
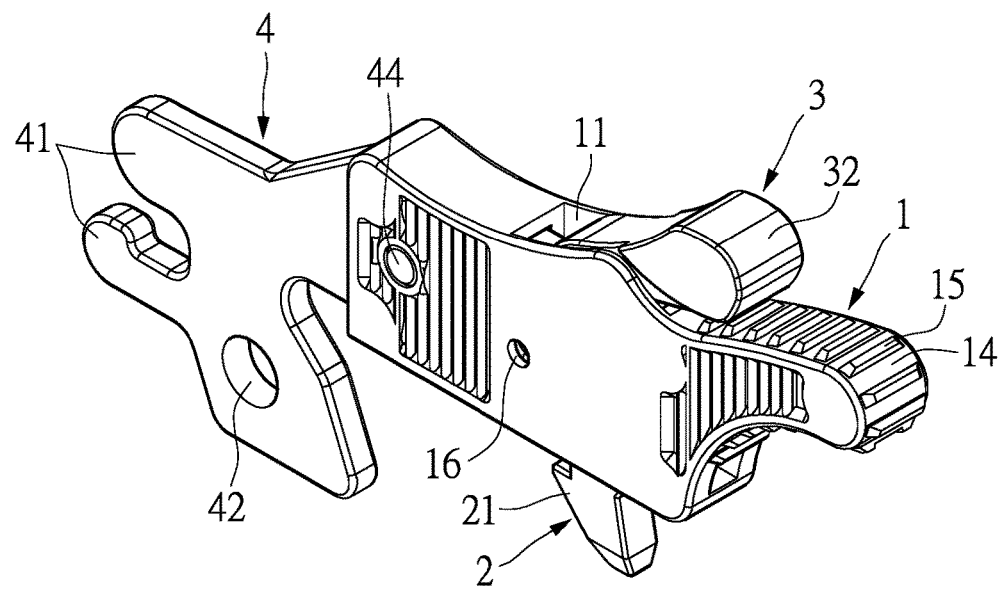
FIG. 2 is an assembly view of the removal assembly according to the first embodiment of the instant disclosure.
Figure 3:
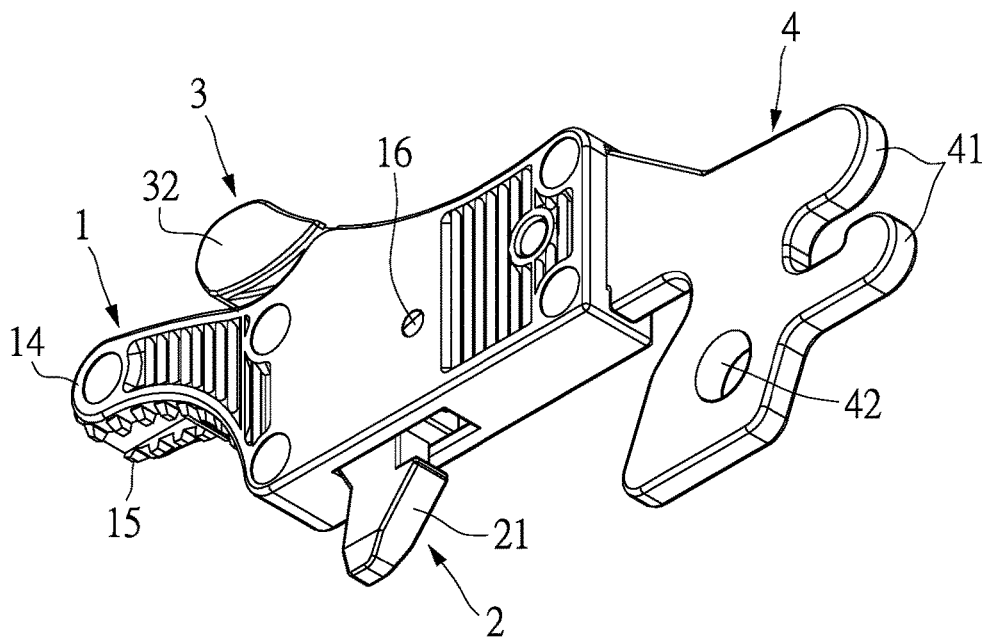
FIG. 3 is another assembly view of the removal assembly according to the first embodiment of the instant disclosure.
Figure 4:
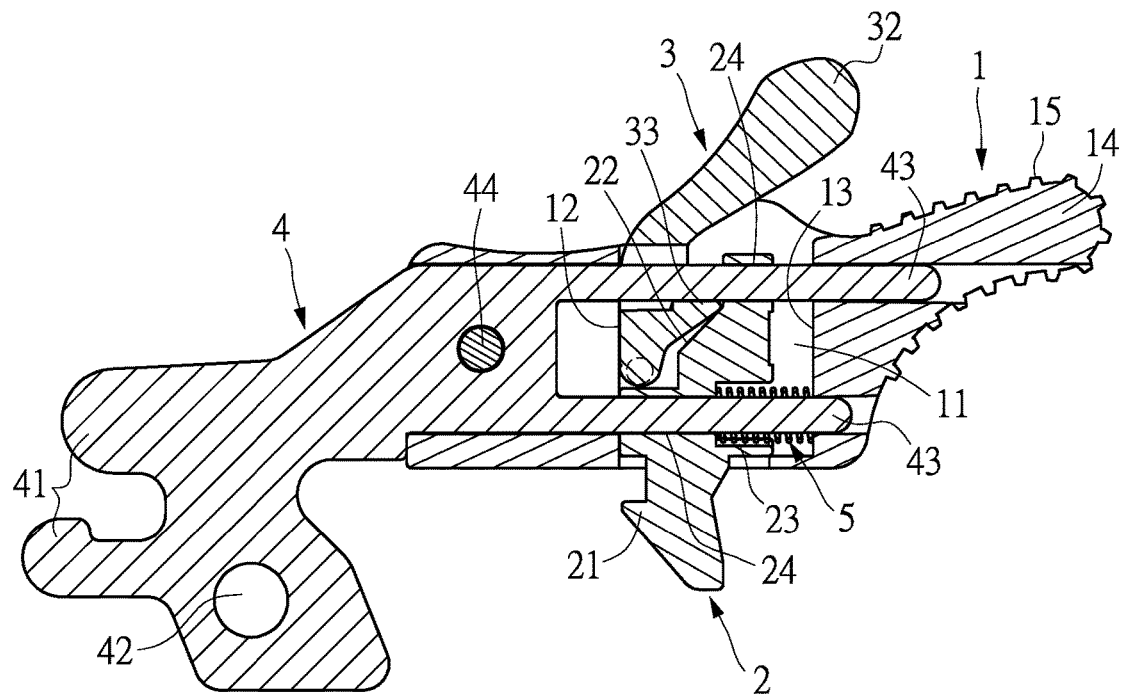
FIG. 4 is a cross-sectional view of the removal assembly according to the first embodiment of the instant disclosure.
Figure 5:
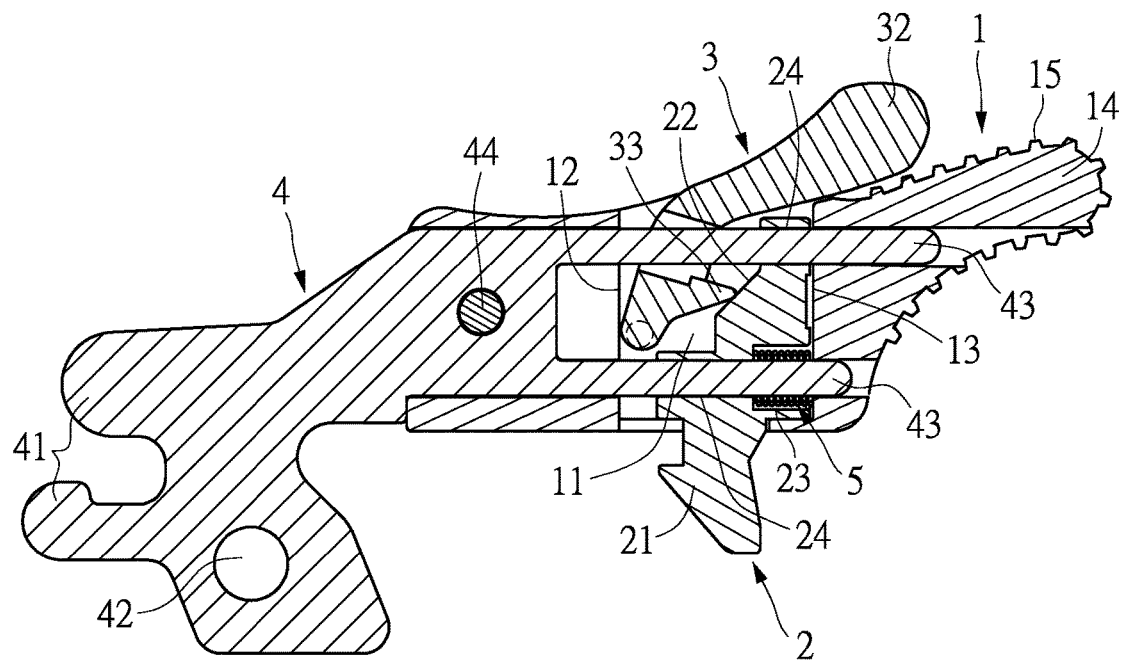
FIG. 5 is a cross-sectional view showing a use state of the removal assembly according to the first embodiment of the instant disclosure.

The aforementioned illustrations and following detailed descriptions are exemplary for the purpose of further explaining the scope of the instant disclosure. Other objectives and advantages related to the instant disclosure will be illustrated in the subsequent descriptions and appended drawings.

The First Embodiment

Please refer to FIGS. 1-5. The embodiment of the present invention provides a removal assembly disposed in a subrack and configured to remove a daughter board from the subrack. The removal assembly includes a main body 1, a positioning element 2, an actuating element 3, and a wrench element 4.

The material of the main body 1 is not particularly restricted. The main body 1 has an inner space 11 exposed from the two opposite sides thereof. The main body 1 includes a starting surface 12 and a stopping surface 13 positioned in the inner space 11 thereof. The main body 1 includes a handle part 14 at one end, and the handle part 14 can be provided with an anti-slipping fringe structure 15 on its peripheral surface. The anti-slipping fringe structure 15 increases the holding force to help hold the handle part 14 in contact.

The positioning element 2 is made from metal, but not restricted thereto. The positioning element 2 is movably disposed in the inner space 11 of the main body 1, and is configured to move between the starting and stopping surfaces 12, 13. Specifically, the positioning element 2 is configured to move relative to the actuating element 3. The positioning element 2 includes a hook-shaped clasp part 21 which extends out of the main body 1 and is configured to engage the daughter board. There is an elastic element 5 disposed between the positioning element 2 and the main body 1. The elastic element 5 enables the positioning element 2 to move relative to the starting surface 12 of the main body 1. For the instant embodiment, the elastic element 5 is preferably a spring, but not restricted thereto.

The positioning element 2 is provided with a containing groove 23 for accommodating a part of the elastic element 5. Two ends of the elastic element 5 abut against one wall of the containing groove 23 of the positioning element 2 and the main body 1 respectively, so that the deformed elastic element 5 can provide a required resilient force. The positioning element 2 is provided with an oblique side surface 22 on its peripheral and opposite to the starting surface 12. The positioning element 2 has two sliding slots 24 which are parallel to each other. The sliding slots 24 of the positioning element 2 extend in a direction perpendicular to the starting and stopping surfaces 12, 13 of the main body 1.

The material of the actuating element 3 is not particularly restricted. The actuating element 3 is pivotally installed in the inner space 11 of the main body 1. Specifically, the main body 1 is provided with two opposite parallel opposite pivot holes 16, and one end of the actuating element 3 is provided with two pivot shafts 31 which are rotatably coupled to the pivot holes 16.

The actuating element 3 includes a pressing part 32 and an abutting part 33 which extends out of the main body 1. The pressing part 32 is configured to apply a force. The abutting part 33 is configured to abut against the oblique side surface 22 of the positioning element 2 when force is applied to the pressing part 32, wherein an angle between the abutting part 33 and the oblique side surface 22 ranges from 0°-90°. Thereby, the actuating element 3 enables the positioning element 2 to move toward the stopping surface 13 of the main body 1.

The wrench element 4 is made from metal, but not restricted thereto. The wrench element 4 is a plate-shaped structural element and includes a fixing part 41 and a pivoting part 42. The front side of the fixing part 41 is formed with a side notch to engage with the subrack (not shown). The pivoting part 42, which may be a pivot hole, is configured to pivotally connect to the daughter board by a pivot pin, so that the removal assembly can rotate relative to the daughter board. The wrench element further includes two guide rails 43 which extend a predetermined distance from its rear side and are parallel to each other.

The wrench element 4 is connected to the main body 1, wherein the guide rails 43 extend through the sliding slots 24 of the positioning element 2 and into the inner space 11 of the main body 1, and one of the guide rails 43 passes through the elastic element 5. The guide rails 43 of the wrench element 4 are slidably coupled to the sliding slots 24 of the positioning element 2 respectively. Thereby, the positioning element 2 can be driven by the elastic element 5 to move stably in the inner space 11 of the main body 1.

Specifically, the wrench element 4 can be connected to the main body 1 by any suitable engaging means. The removal assembly further includes a retaining pin 44 mounted through the wrench element 4 and the main body 1, so that the wrench element 4 can be installed on the main body 1.

The Second Embodiment

Figure 6:
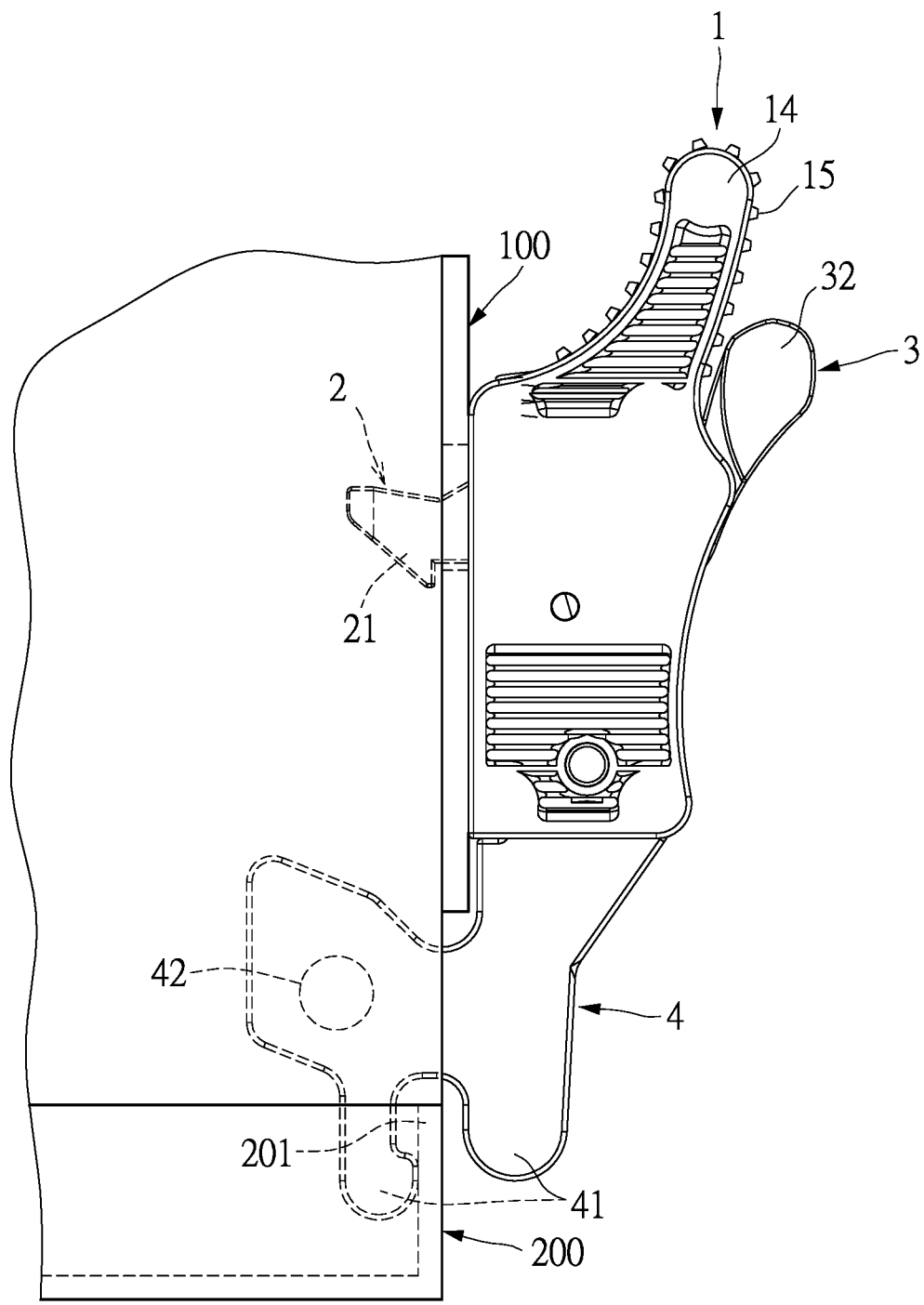
FIG. 6 is a schematic view showing the removal assembly disposed in a subrack according to the first embodiment of the instant disclosure.

Please refer FIG. 6. The removal assembly is capable of installing a daughter board 100 in the subrack 200. The subrack 200 may be an industrial PC subrack. Specifically, the pivoting part 42 of the wrench element 4 is pivotally mounted to a base inside the daughter board 100, and the fixing part 41 is clamped on a housing 201 of the subrack 200, so that the clasp part 21 of the positioning element 2 can be fittingly engaged with the daughter board 100. Thereby, the daughter board 100 can be prevented from detaching from the subrack 200.

A working principle of this embodiment is as follows:

The removal assembly has a first state and a second state. In the first state, the actuating element 3 rotates relative to the main body 1 when force is applied to its pressing part 32, wherein the rotation range is restricted by the elastic element 5. The abutting part 33 of the actuating element 3 then abuts against the oblique side surface 22 of the positioning element 2 to allow the positioning element 2 to move toward and be stopped at the stopping surface 13 of the main body 1 (shown in FIG. 3). Thereby, the clasp part 21 of the positioning element 2 can be detached from the daughter board 100, and the fixing part 41 of the wrench element 4 can be detached from the housing 201 of the subrack 200 when thrust is applied to the handle part 14 of the main body 1. Thus, the daughter board 100 is pulled out the subrack 200. In the second state, the positioning element 2 can be driven by the elastic element 5 to move toward and be stopped at the starting surface 12 of the main body 1.

Based on the above, the instant disclosure relates to a removal assembly, which includes a main body, a positioning element, an elastic element, an actuating element, and a wrench element. In a use state, the elastic element is configured to restrict motion of the actuating element relative to the positioning element, wherein the abutting part of the actuating element is configured to abut against the oblique side surface of the positioning element when force is applied to the pressing part of the actuating element. Thereby, thrust control can be easily carried out.

In addition, the main body includes a starting surface and a stopping surface positioned in the inner space thereof. The actuating element enables the positioning element to move between the starting and stopping surfaces of the main body.

There is an elastic element disposed between the positioning element and the main body. The deformed elastic element can provide a required resilient force to restrict the motion of the positioning element.

The positioning element has two sliding slots which are parallel to each other, and the wrench element includes two guide rails slidably coupled to the sliding slots respectively. Thereby, the positioning element can be driven by the elastic element to move stably in the inner space of the main body, so that the clasp part of the positioning element can be fittingly engaged with the daughter board.

The descriptions illustrated supra set forth simply the preferred embodiments of the instant disclosure; however, the characteristics of the instant disclosure are by no means restricted thereto. All changes, alterations, or modifications conveniently considered by those skilled in the art are deemed to be encompassed within the scope of the instant disclosure delineated by the following claims.

What is claimed is:

1. A removal assembly comprising:
a main body having an inner space, wherein the main body comprises a handle part at one end thereof;
a positioning element movably disposed in the inner space of the main body, wherein the positioning element comprises a clasp part and an oblique side surface, and the clasp part extends out of the main body;
an elastic element disposed between the main body and the positioning element;
an actuating element pivotally installed in the inner space of the main body, wherein the actuating element comprises a pressing part and an abutting part, the pressing part extends out of the main body, and the abutting part abuts against the oblique side surface of the positioning element; and
a wrench element connected to the main body, wherein the wrench element comprises a fixing part and a pivoting part;
wherein when a force is applied to the pressing part of the actuating element, the abutting part of the actuating element abuts against the oblique side surface of the positioning element to allow the positioning element to move toward and be stopped at a stopping surface of the main body;
wherein when the force is released to the pressing part of the actuating element, the positioning element is driven by the elastic element to move toward and be stopped at a starting surface of the main body; and
wherein the positioning element has two sliding slots which are parallel to each other, the wrench element comprises two guide rails slidably coupled to the sliding slots respectively, and the guide rails extend through the sliding slots and into the inner space of the main body.

2. The removal assembly according to claim 1, wherein the main body comprises the starting surface and the stopping surface positioned in the inner space thereof, the positioning element is configured to move between the starting and stopping surfaces, and the oblique side surface is opposite to the starting surface.

3. The removal assembly according to claim 1, wherein the elastic element is a spring.

4. The removal assembly according to claim 1, wherein the positioning element has a containing groove, a part of the elastic element is disposed in the containing groove, and two ends of the elastic element abut against one wall of the containing groove and the main body respectively.

5. The removal assembly according to claim 1, wherein one of the guide rails of the wrench element passes through the elastic element.

6. The removal assembly according to claim 1, wherein the main body is provided with two opposite parallel opposite pivot holes, and one end of the actuating element is provided with two pivot shafts rotatably coupled to the pivot holes of the main body.

7. The removal assembly according to claim 1, wherein the elastic element is configured to restrict motion of the actuating element relative to the positioning element, and wherein an angle between the abutting part of the actuating element and the oblique side surface of the positioning element ranges from 0°-90°.

8. The removal assembly according to claim 1, further comprising a retaining pin mounted through the wrench element and the main body.

* * * * *